United States Patent [19]

Eiberger et al.

[11] Patent Number: 4,932,041
[45] Date of Patent: Jun. 5, 1990

[54] CIRCUIT FOR OBTAINING A BIT-RATE CLOCK SIGNAL FROM A SERIAL DIGITAL DATA SIGNAL

[75] Inventors: Berthold Eiberger; Michael Philipps, both of Darmstadt; Rolf Schiffmann, Mainz; Peter Ries, Seeheim-Jugenheim, all of Fed. Rep. of Germany

[73] Assignee: BTS Broadcast Television Systems GmbH, Darmstadt

[21] Appl. No.: 215,742

[22] Filed: Jul. 6, 1988

[30] Foreign Application Priority Data

Jul. 7, 1987 [DE] Fed. Rep. of Germany ....... 3722328

[51] Int. Cl.$^5$ ............................................. H03D 3/24
[52] U.S. Cl. ..................................... 375/120; 331/11
[58] Field of Search ............... 375/120, 119; 331/1 A, 331/36 R, 36 C, 10, 11, 12; 332/30 V, 12 F; 360/51; 329/112

[56] References Cited

U.S. PATENT DOCUMENTS

| | | | |
|---|---|---|---|
| 4,151,485 | 4/1979 | La Fratta | 331/1 A |
| 4,267,595 | 5/1981 | Hernandez | 375/95 |
| 4,388,596 | 6/1983 | Yamashita | 331/11 |
| 4,667,170 | 11/1987 | Loforen et al. | 331/17 |
| 4,803,705 | 2/1989 | Gillinoham et al. | 375/120 |

OTHER PUBLICATIONS

International Conference on Communications, Philadelphia, USA, Communication Record, Jun. 1976, pp. 10-17 to 10-20.

Primary Examiner—Benedict V. Safourek
Assistant Examiner—Tesfaldet Bocure
Attorney, Agent, or Firm—Frishauf, Holtz, Goodman & Woodward

[57] ABSTRACT

To the phase locked loop for controlling the oscillator that regenerates a bit-rate clock signal from a data signal by means of a phase comparison circuit followed by a low pass filter, the output of which controls the oscillator frequency, a digital frequency comparison circuit is provided for assuring that the oscillator frequency will be brought into the capture range of the phase locked loop. The output of the digital frequency comparison circuit is converted from digital to analog form for being used in combination with the low pass filter output to control the oscillator. Frequency and phase control signals are applied to opposite electrodes of a variable capacitance diode in the frequency determining circuit of the oscillator. In order to improve the operation the frequency comparison circuit, delayed and undelayed oscillator output clock signals are sampled by transitions of the data signal for respectively incrementing or decrementing a counter, the state of which is then converted into an anlog signal for contributing to the control of the oscillator. The data signal also is provided in delayed and undelayed forms, and these are combined in an exclusive-OR gate, the output of which is used both in the phase comparison circuit and in the sampling portion the frequency comparison circuit. That portion of the frequency comparison circuit controls a pair of monoflops through D-flipflops so as to provide the necessary incrementing or decrementing pulses for the counter.

9 Claims, 5 Drawing Sheets

CIRCUIT FOR OBTAINING A BIT-RATE CLOCK SIGNAL FROM A SERIAL DIGITAL DATA SIGNAL

This invention concerns circuits including a phase locked loop, a phase comparison circuit and a controllable oscillator for obtaining a bit-rate clock signal from a digital data signal. Circuits of this kind are known in which the controllable oscillator is controlled by the phase comparison circuit.

On a count their particular information content most digital signals do not have any signal level jumps during every bit period, in obtaining a clock signal digital signals therefore, longer pauses of the signal at the same level must be bridged, which in principal is possible with a phase control loop having a flywheel effect. Such a loop, however, has only a small time window during which it can be phase corrected, so that the frequency of the controllable oscillator must already lie in a narrow tolerance region adjacent to the clock signal frequency.

For the reason just stated, quartz controlled oscillators are frequently used for obtaining the clock signal, which again assumes that the arriving digital signals are correspondingly accurate in their timing. Especially in reproduction of digital signals recorded on a magnetic tape, such precision of timing cannot be assured.

As the result circuits have become known in which a frequency comparison is carried out in addition to the operation of the phase loop and the result of the frequency comparison is superimposed upon the control voltage in the phase locked loop. By the frequency comparison it is possible to bring the oscillator to a frequency at which its phase can be controlled and as soon as the compared frequency are substantially equal, the control of the phase takes place by means of the phased lock loop. Such a circuit has become known through the publication J. A. Dellisio, "A New Phase Locked Timing Recovery Method for Digital Regenerators," International Conference on Communications, Philadelphia, USA, Communication Record, June 1976 pp. 10-17 to 10-20, IEEE Catalog Number 76 CH 1085-0 CSCB. The frequency comparison circuit their recommended, however, does not meet all the requirements of precise regeneration of a bit rate clock signal.

SUMMARY OF THE INVENTION

It is an object of the present invention to provide a practical circuit of the above described kind by which precise frequency comparison is possible and which will bring the controllable oscillator, during its approach to the clock signal frequency, reliably into the narrow frequency range necessary for phase comparison control. It is a further object of the invention to provide such a circuit which is unaffected by unavoidable scatter of characteristics within manufacturing tolerances or by thermal variations. More particularly it is an object of the invention to provide a bit rate clock signal recovery circuit that can be reliably used in reproduction of video signals recorded on a magnetic tape, for example, recorded in accordance with the so called D1 standard, the details of which are set forth in the publication "Standard for Recording Digital Television Signals on Magnetic Tape in Cassettes" of the European Broadcasting Union, TECH-3252-E and in the Fernseh- und-Kinotechnik 1987, Heft, ½, pages 15-22.

Briefly, these objects are attained by utilizing a digital frequency comparison circuit to which the data signal and the regenerated clock signal are supplied and having an output connected to a digital to analog converter, the output of which, together with a output signal of the phase comparison circuit is supplied to the controllable oscillator. In the digital frequency comparison circuit both the clock signal and a delayed clock signal are sampled at transitions (flanks) of the data signal. From the signals obtained by this sampling upwards and downwards pulses are derived which are supplied to a counter, the output of which is connected with the input of the digital to analog converter.

The invention can also be used advantageously for purposes other than processing of video signals reproduced from magnetic tape, particularly whenever propagation time fluctuations take place in the transmission path of a digital signal. A jump-like change of the propagation time takes place, for example, in the case of input signals from synchronizers to a digital picture memory, when switch-overs are formed between different transmission paths.

Further improvements involved in referred details of the circuits of the invention will be more readily understood with the benefit of a illustrated detailed description that follows.

BRIEF DESCRIPTION OF THE DRAWINGS

The invention is further described by way of illustrative example with reference to the annexed drawings, in which.

In various figures the same parts are shown with the same reference numerals.

DESCRIPTION OF THE ILLUSTRATED EMBODIMENTS

Figure 1:
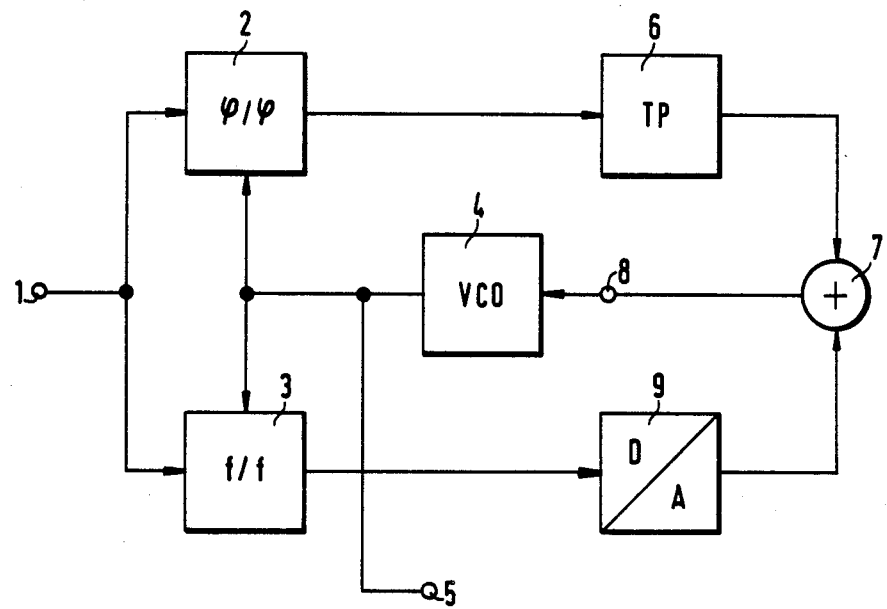
FIG. 1 is a circuit diagram of a circuit according to the invention.

A serial digital data signal which may have been coded in any of a wide variety of ways is supplied to the input 1 to the circuit of FIG. 1. A possible variety of coding of the signals means that it is not necessary that within the signal regularly occurring signal transitions from one logic level to another should be available for synchronization. It is assumed, however, that even the transmission signals of the same form, thus for example very many ones or zeroes, should show transitions from one logic level to another at intervals that are not unduly or unreasonably long. Suitable codes for assuring this last requirement are well known and do not need to be further explained in connection with the present invention. In the preferred field of application for the circuit of the invention, namely the production of video signals from a magnetic tape, sufficiently short time intervals between signal transitions are already assured by the fact that recording a d.c. signal on a magnetic tape is not possible, nor reproduction of that signal. For that reason in a known and widely used process for recording and reproducing digital video signals on magnetic tape the superposition of a quasi-random signal on the signals to be recorded is performed.

The data signal proceeds from the input of FIG. 1 to a phase comparison circuit 2 and to a frequency comparison circuit 3. The output signal of a controllable oscillator 4 is likewise supplied to both of the circuits 2 and 3. The output 5 of the controllable oscillator serves the same time as the output of the overall circuit shown in FIG. 1 which provides precisely timed bit rate clock signals for use in other circuits not shown.

The phase comparison circuit 2 in a well known way provides output voltage in a manner dependent upon the phase difference between the data signal and the enumerated clock signal. That analog output voltage is then supplied through a low pass filter 6 and an addition circuit 7 to the control input 8 of the controllable oscillator 4. Since the data signal has irregularity dependent upon its data content, a relatively large time constant is necessary for the low pass filter 6 in order for the controllable oscillator 4 to provide a clock signal of which the frequency is to a great extent independent of the information content of the data signal. This means that the low pass filter 6 must have cut off frequency that is locked loop formed by the phase comparison circuit to the low pass filter 6 and the controllable oscillator 4 to a very small interval. In order that the circuit of FIG. 1 should make possible synchronization even for a greater frequency deviation, the output signal of the frequency comparison circuit 3 additionally controls the oscillator 4. For that purpose the digital output signal of the frequency comparison circuit 3 is supplied to a digital analog converter 9, the output of which is connected to the one of the inputs of the addition circuit 7.

Figure 2:
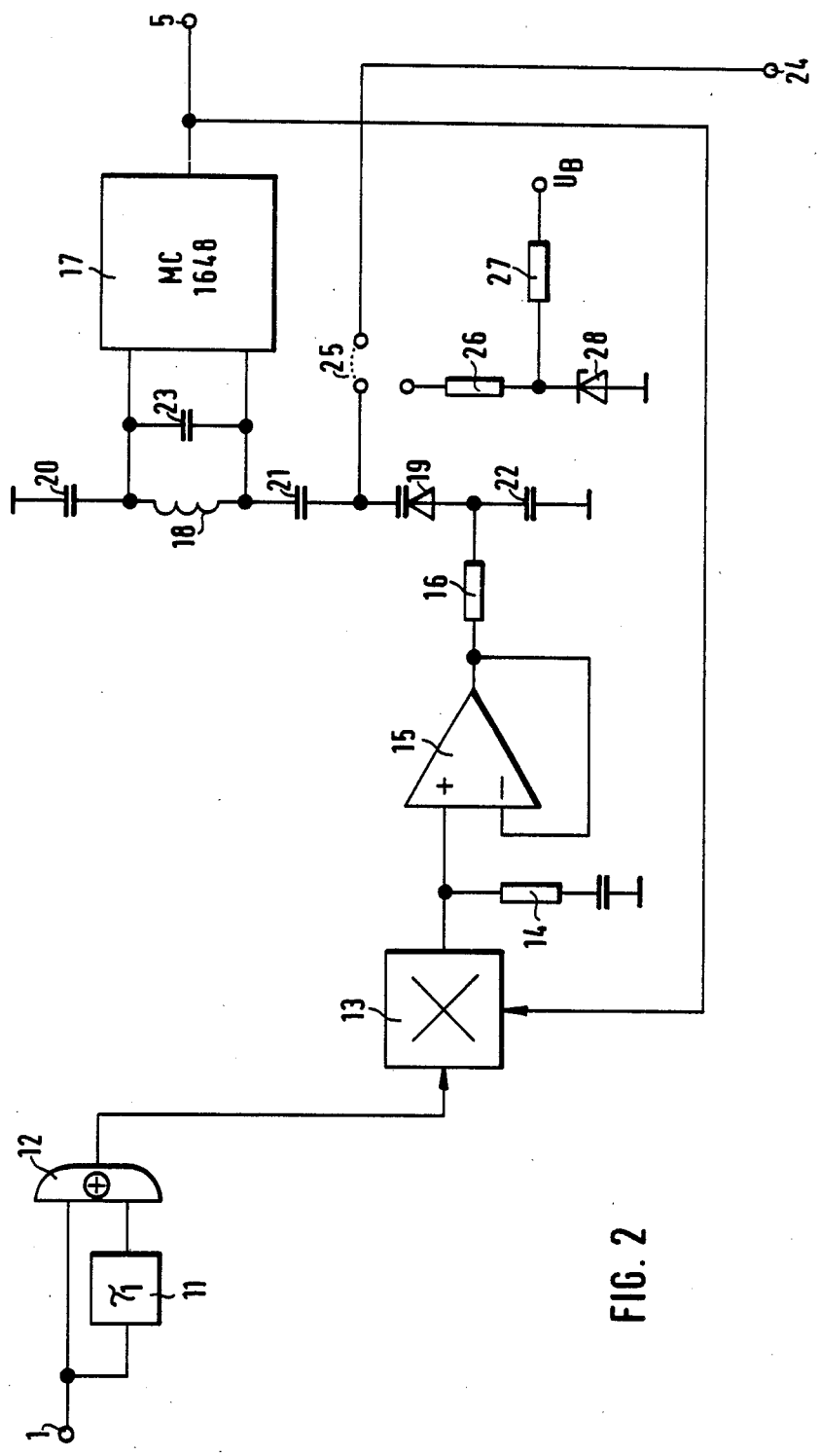
FIG. 2 is a block circuit diagram of the phase comparison circuit and the controllable oscillator of the circuit of FIG. 1 in somewhat more detailed representation.

FIG. 2 shows that the data signal from the input terminal 1 supplied on the one hand directly and on the other hand through a delay circuit 11 to an exclusive-OR gate 12. The delay period of the delay circuit 11 is equal to half a bit period of the data signal. In consequence, the signal at the output of the exclusive-OR gate has a frequency twice as great as that of the data signal. This signal is supplied to one input of a multiplication circuit 13, the other input of which is supplied with the clock signal of the output terminal 5 which is the output of the overall circuit.

The use of a multiplication stage for purposes of phase comparison is in itself known and therefore does not need to be described in more detail here. A commercially available integrated circuit unit of the type designation TDA 820T, for example, is suitable for the multiplication circuit 13. The analog output signal of the multiplication circuit 13 is put through a low pass filter 14, from which it proceeds to an operational amplifier 15 which is connected as an impedance converter, the output of which is furnished, through a resistance 16 to the controllable oscillator at a circuit point suitable for controlling the oscillator frequency.

The oscillator in FIG. 2 that corresponds to the oscillator 4 of FIG. 1 consists essentially of an integrated circuit 17 of type MC 1648 which is specifically designed as a controllable oscillator. It uses, as an external frequency determining circuit a parallel resonant circuit composed of an inductance 18, the capacitors 20 to 23 and a variable capacitance diode 19. It is the variable capacitor 19 that is affected by the signals supplied to the oscillator through the resistance 16. At the output 5 of the overall circuit there is made available the clock signal generated by the oscillator 17.

The output signal of the digital to analog converter 9 of FIG. 1 is supplied to the oscillator shown in FIG. 2 through an additional input 24 of the circuit of FIG. 2, as a further control voltage by the path shown in FIG. 2. Since here the control voltages are supplied to respective electrodes of the capacitance variation diode 19, it is unnecessary in the circuit of FIG. 2 to have a separate addition circuit as shown in FIG. 1. Between the input 24 and the cathode of the capacitance variation diode 19 there is interposed a provision 25 for interposition of either a solder bridge shown by a dotted line or a shunting plug connection by which, instead of the control voltage supplied at the terminal 24 there can be supplied to the cathode of the capacitance variation diode 19 a constant voltage derived from the operating supply voltage $U_B$ by means of the resistances 26 and 27 and the Zener diode 28. This makes possible calibration of the frequency of the oscillator by means of the capacitor 23 after a measuring signal of constant frequency is supplied at the terminal 1 in such a way that the middle of the control range of the phase locked loop lies at this constant frequency when the control voltage supplied at 24 also lies in the middle of its control range.

Figure 3:
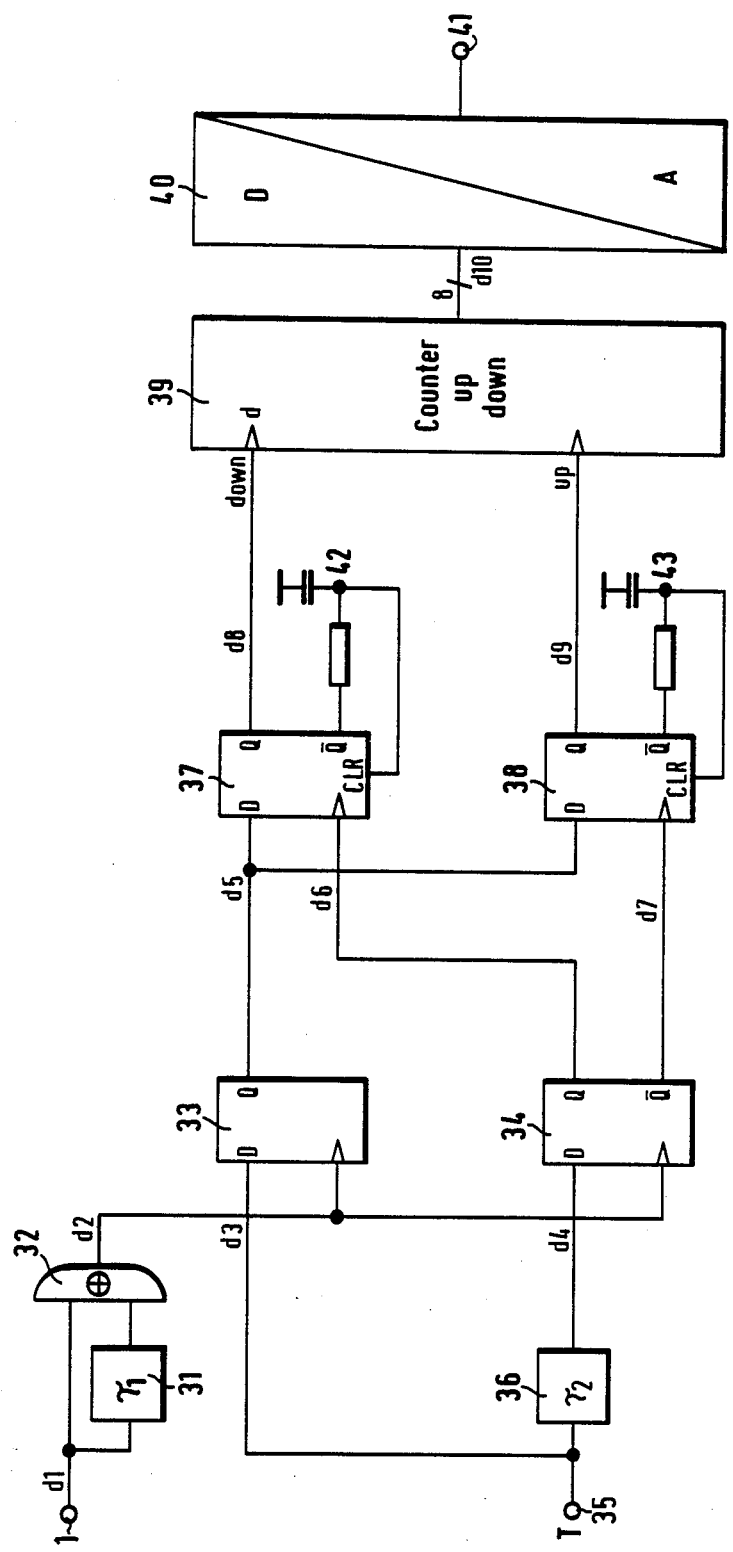
FIG. 3 is a correspondingly more detailed block circuit diagram of a frequency comparison circuit for the circuit of FIG. 1.

In the illustration of frequency comparison circuit shown in FIG. 3, the delay circuit 31 and the exclusive-OR gate 32 are connected to the input 1 as already shown in connection with FIG. 2. The output signal of the exclusive-OR gate 32 is supplied to the clock inputs of two D-flipflops 33, 34. The data input of the D-flipflop 33 is connected with an input 35 for the clock signal T, while the data input of the flipflop 34 is connected through a delay circuit 36 to the input 35. The output Q of the D-flipflop 33 is connected with the data input of additional D-flipflops 37 and 38 which are clocked by the inverted and noninverted output signals, respectively, of the D-flipflops 34.

The output signals of the D-flipflops 37 and 38 are supplied to a bidirectional counter 39 with each change of state of a flipflop and in each case induce a change of counter content either upwards or downwards. The 8-bit wide signal of the counter 39 goes to a digital to analog converter 40 which provides a corresponding analog signal that is used as the control voltage from the output 41 supplied to the controllable oscillator of FIG. 2 through the input terminal 24 of FIG. 2. A suitable counter and a suitable digital to analog converter for the circuit of FIG. 3 are respectively the components available under the type designation of 74 HC 193 and DAC-08.

Figure 4:
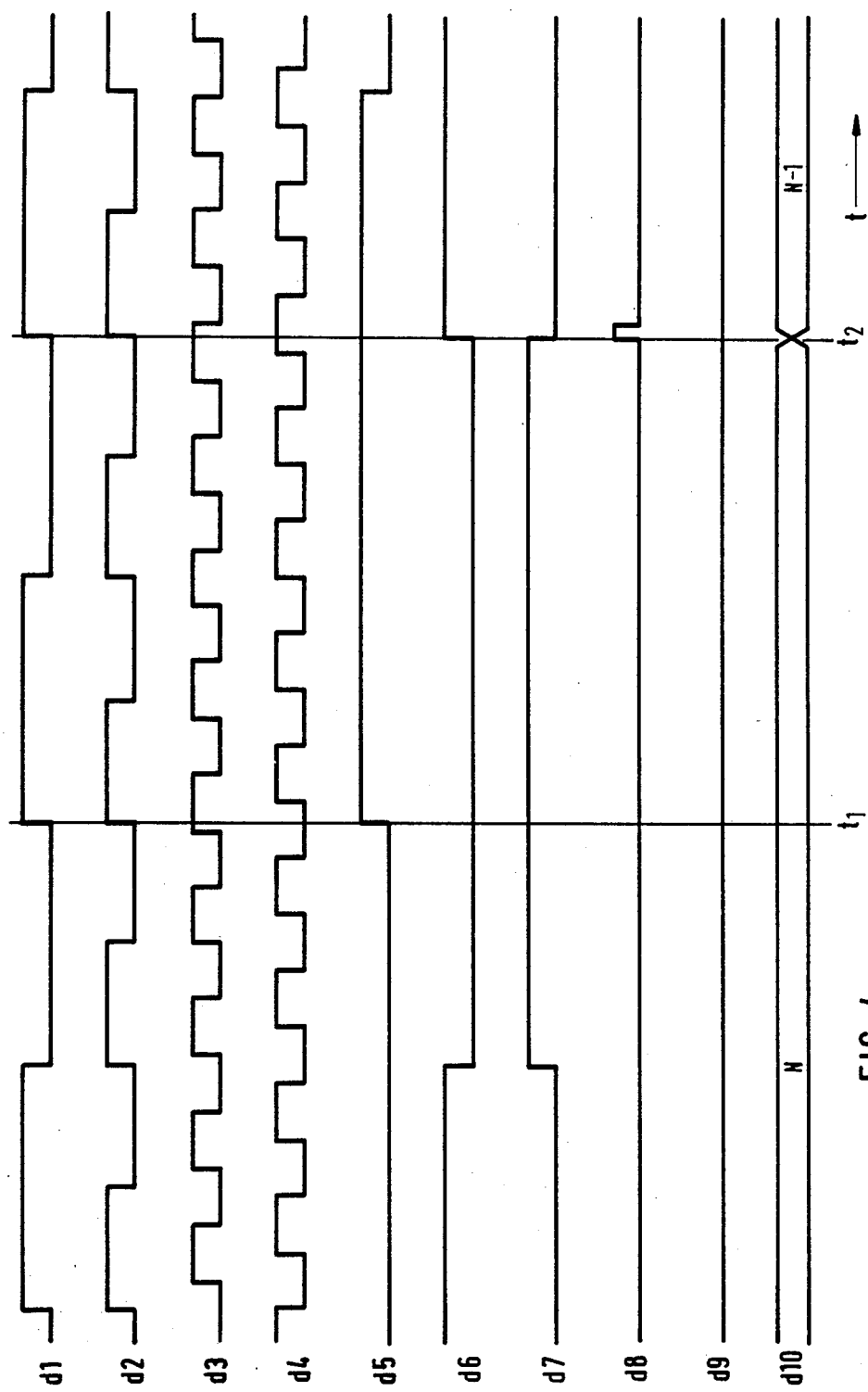
FIG. 4 is a timing diagram showing, on a common time scale, signals occurring in the circuit of FIG. 3 when the oscillator frequency is greater than a reference frequency value.
Figure 5:
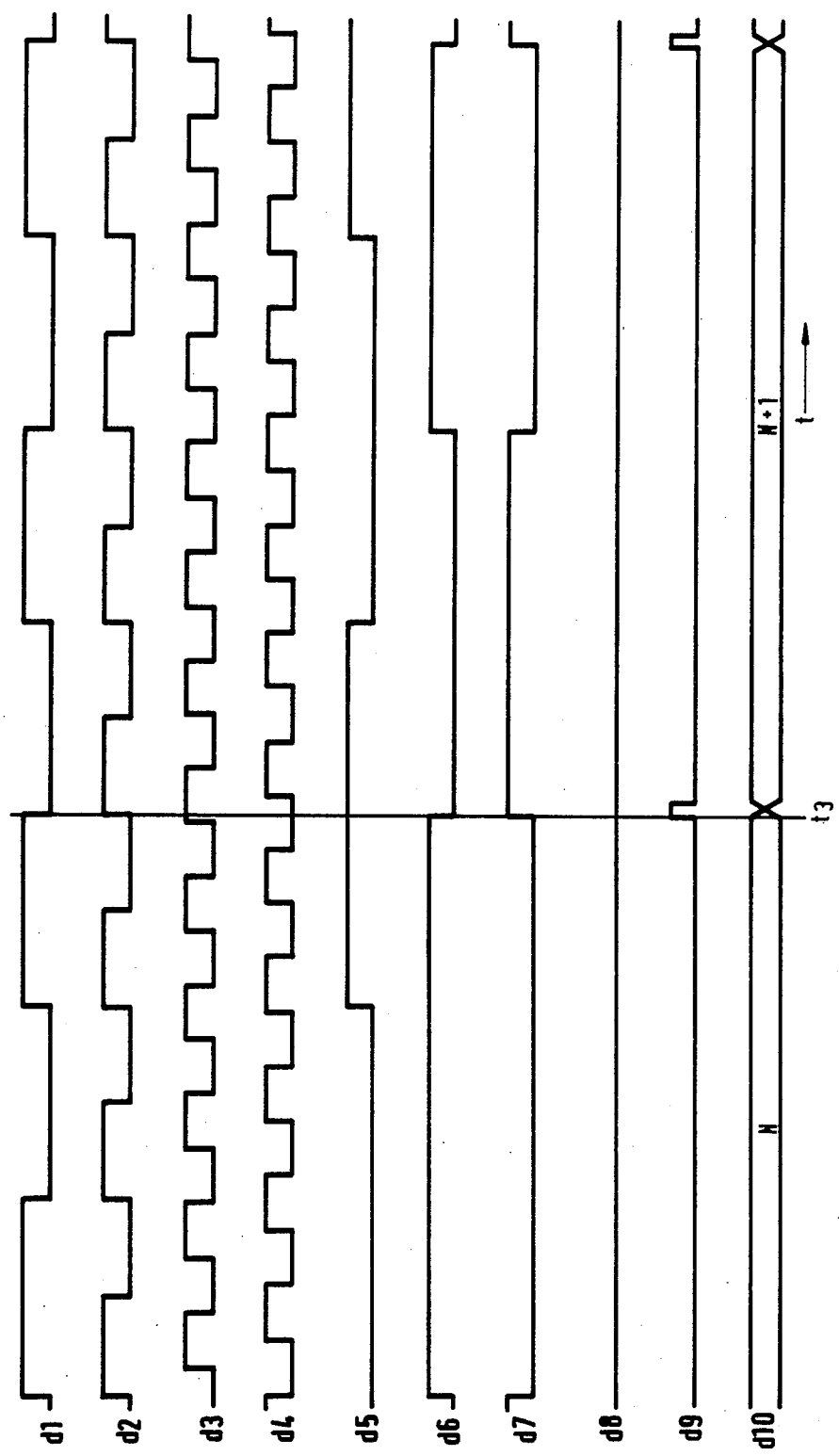
FIG. 5 is a timing diagram like FIG. 4 showing the same signals for the case in which the oscillator frequency is smaller than the reference frequency value.

The function of the frequency comparison circuit according to FIG. 3 will now be further explained with reference to the timing diagrams of FIGS. 4 and 5. In those figures the signals shown are provided with designations d1, d2..d10 which correspond to the points similarly designated in the circuit of FIG. 3. FIG. 4 illustrates the case in which the frequency of the clock signal is greater than that of a reference value, while FIG. 5 illustrates the case where the frequency of the clock signal is smaller than the reference value. The data signal d1 of FIGS. 4 and 5 is assumed, by way of illustration, to be a meander-shaped signal with a frequency of about 20 MHz, such as usually precedes the individual data blocks in the output of known digital video tape equipment for "running in" the bit synchronization. The signal d1 can, however, also have another shape that may be depend upon information content, with corresponding useful results for the other signals.

The signal d2 is derived, as already explained, by the delay circuit 31 and the exclusive-OR gate 32 and has a frequency twice as great as that of the signal d1. Each of the two-half periods of the signal d2 are now to be correlated with a clock pulse. The clock signal T shown in line d3 deviates in frequency, however, so that a phase shift with respect to the signal d2 gradually takes place. The signal d4 corresponds to the clock signal d3 with respect to frequency and keying ratio (duty cycle), but is shifted by 90° by the effect of the delay circuit 36. With each positive flank of the signal d2 the then existing states of the signals d3 and d4 are respectively taken over into the D-flipflop 33 changes from 0 to 1 at the instant t1 at which the signal d3 in FIG. 4 has for the first time the logic state 1 resulting from the presence of a positive flank of d2.

Both the noninverted and the inverted output signals d6 and d7 are supplied from the D-flipflop 34 to the clock inputs of the D-flipflops 37 and 38. When there is a positive flank of the signal d6, the value (i.e. state) of the signal d5 is written into the D-flipflop 37, while on the occurrence of a positive flank of the signal d7 the value of the signal d5 is written into the D-flipflop 38. If the frequency of the clock signal d3 is greater than the reference value, the signal d5 has the value 1 when there is a positive flank of the signal d6, so that the D-flipflop 37 will be set. The D-flipflop 37 and likewise the D-flipflop 38 are connected as monoflops by means of the low pass feedback circuit branches 42 and 43 respectively. At the instant t2, therefore, there appears at the output Q of the D-flipflop 37 the short pulse shown in line d8 which produces a decrementation of the counter 39, which is illustrated in line d10 of FIG. 4 by means of the transition from N to N-1.

As the result the control voltage, which appears at the output 41 of FIG. 3, rises and the frequency of the oscillator is reduced, so that the next pulse signal d8 (not shown in FIG. 4) follows after a longer interval. As soon as the capture or lock-in region of the phase comparison circuit 2 of FIG. 1 is reached, phase control begins, as the result of which the clock frequency is brought accurately to the reference value. Isolated pulses d8 or d9 (FIG. 5) occur only through random fluctuations.

In the case illustrated in FIG. 5, where the frequency is less than the reference value, the value of the signal d5 is logic 1 at the time of the positive flank of the signal d7, so that pulses appear at the output of the D-flipflop 38 which increment the counter 39. One of these pulses is illustrated in FIG. 5 at the instant t3. The change of the control voltage resulting from the incrementation of the counter from N to N+1 produces a rise of the oscillator frequency until the capture region of the phase locked loop is again reached.

Although the invention has been described with reference to a particular illustrated embodiment, it will be understood that modifications and variations are possible within the inventive concept.

We claim:

1. Circuit for obtaining a bit-rate clock signal from a digital data signal, including a phase locked loop circuit comprising a phase comparison circuit, a low-pass filter and a controllable oscillator, said digital data signal and the output of said oscillator being supplied to said phase comparison circuit respectively at a data input and at a clock signal input thereof and the output of said phase comparison circuit providing an analog output voltage and being connected through said low pass filter to a control circuit of said oscillator, said low pass filter having an output connection, the output of said oscillator providing the bit-rate clock signal generated by the circuit, said circuit further comprising:

a digital frequency comparison circuit (3) comprising means (36) for deriving a delayed clock signal from the clock signal output of said oscillator such that logic level transitions of said delayed clock signal are interleaved in time between logic level transitions of the undelayed clock signal, means for sampling said clock signal and said delayed clock signal at the occurrence of rising and falling flanks of said data signal, a bidirectional counter (39) having a count state output and connected so as to be incremented and decremented by outputs of said sampling means in a manner bringing the count state of said counter into correspondence with a reference value related to the bit frequency of said data signal;

a digital to analog converter (9, 40) having an output and having its digital input connected to the count state output of said counter, and means (7) for applying the analog output of said digital to analog converter and the output of said low pass filter additively to a control circuit of said oscillator, whereby said output of said D/A converter is not filtered by said low pass filter, said clock signal output of said oscillator being directly connected to said delayed clock signal deriving means, to said sampling means of said digital frequency comparison circuit and also to said clock signal input of said phase comparison circuit.

2. Circuit according to claim 1 further comprising means (11) for delaying said data signal by half of a nominal bit period thereof and exclusive-OR circuit means (12) for combining the resulting delayed signal with said data signal as undelayed, the output of said exclusive-OR circuit means being connected to supply said combined data signal to said phase comparison means (13).

3. Circuit according to claim 2, wherein said means for sampling said delayed and undelayed clock signals together with said connection of said counter for incrementation and decrementation comprises:

first and second D-flipflops (33, 34) having their clock inputs both connected to the output of said exclusive-OR gate circuit means (13) and having their data inputs respectively connected for receiving said clock signal and said delayed clock signal;

third and fourth D-flipflops (37, 28) having their respective data inputs connected to an output of said first D-flipflop (33), the noninverting output of said second D-flipflop (34) being connected with the clock input of said fourth D-flipflop (38), said third and fourth flipflops being connected as monoflops and having outputs respectively connected to downcounting and upcounting inputs of said bidirectional counter (39).

4. Circuit according to claim 1, wherein said controllable oscillator comprises a frequency determining circuit including a variable capacitance diode (19) having one electrode thereof connected to the output of said digital to analog converter (9, 40) and another electrode to said low pass filter (6,14), whereby additive control of said oscillator by said phase comparison circuit and by said frequency comparison circuit is provided.

5. Circuit according to claim 2, wherein said controllable oscillator comprises a frequency determining circuit including a variable capacitance diode (19) having one electrode thereof connected to the output of said digital to analog converter (9, 40) and another electrode to said low pass filter (6, 14), whereby additive control of said oscillator by said phase comparison circuit and by said frequency comparison circuit is provided.

6. Circuit according to claim 3, wherein said controllable oscillator comprises a frequency determining circuit including a variable capacitance diode (19) having one electrode thereof connected to the output of said digital to analog converter (9, 40) and another electrode to said low pass filter (6, 14), whereby additive control of said oscillator by said phase comparison circuit and by said frequency comparison circuit is provided.

7. Circuit as defined in claim 4 comprising means for temporarily substituting, in place of the output of said digital to analog converter, a substantially constant voltage of predetermined value which is temporarily substituted for calibration or test purposes.

8. Circuit as defined in claim 5 comprising means for temporarily substituting, in place of the output of said digital to analog converter, a substantially constant voltage of predetermined value which is temporarily substituted for calibration or test purposes.

9. Circuit as defined in claim 6 comprising means for temporarily substituting, in place of the output of said digital to analog converter, a substantially constant voltage of predetermined value which is temporarily substituted for calibration or test purposes.

* * * * *